United States Patent
Lin et al.

(10) Patent No.: US 9,570,584 B2
(45) Date of Patent: Feb. 14, 2017

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Chih Hsiung Lin, Hsinchu County (TW); Chia-Der Chang, Hsinchu (TW); Pin-Cheng Hsu, Hsinchu County (TW); Min-Hsiung Chiang, New Taipei (TW); Shu-Wei Chung, Taichung (TW); Hao Wen Hsu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/459,829

(22) Filed: Aug. 14, 2014

(65) Prior Publication Data

US 2016/0049464 A1 Feb. 18, 2016

(51) Int. Cl.
| H01L 29/06 | (2006.01) |
| H01L 29/66 | (2006.01) |
| H01L 29/78 | (2006.01) |
| H01L 29/08 | (2006.01) |
| H01L 29/165 | (2006.01) |

(52) U.S. Cl.
CPC ..... *H01L 29/66636* (2013.01); *H01L 29/0847* (2013.01); *H01L 29/66659* (2013.01); *H01L 29/7835* (2013.01); *H01L 29/7847* (2013.01); *H01L 29/7848* (2013.01); *H01L 29/165* (2013.01)

(58) Field of Classification Search
CPC ........... H01L 29/7816; H01L 29/66681; H01L 29/0615; H01L 29/66431; H01L 29/66636; H01L 29/66659; H01L 29/7835; H01L 29/7848; H01L 29/0847; H01L 29/7847; H01L 29/165
USPC .. 257/192, 339, E21.409, E21.192; 438/286, 285, 287

See application file for complete search history.

(56) References Cited

U.S. PATENT DOCUMENTS

| 7,816,744 | B2 | 10/2010 | Su et al. | |
| 2008/0246080 | A1* | 10/2008 | Ito et al. | 257/328 |
| 2011/0156142 | A1 | 6/2011 | Teo et al. | |
| 2011/0256682 | A1* | 10/2011 | Yu et al. | 438/287 |
| 2013/0093015 | A1* | 4/2013 | Pal et al. | 257/339 |
| 2013/0200445 | A1* | 8/2013 | Lee | H01L 29/78 257/288 |

* cited by examiner

*Primary Examiner* — Cuong Q Nguyen
*Assistant Examiner* — Tong-Ho Kim
(74) *Attorney, Agent, or Firm* — Chun-Ming Shih

(57) ABSTRACT

Some embodiments of the present disclosure provide a semiconductor device including a substrate and a gate structure on the substrate. A first well region of a first conductivity type is in the substrate, close to a first sidewall of the gate structure. A second well region of a second conductivity type is also in the substrate close to the second sidewall of the gate structure. A conductive region is disposed in the second well region. The conductive region can be an epitaxy region. A chemical composition inside the second well region between the conductive region and the gate structure is essentially homogeneous as a chemical composition throughout the second well region.

18 Claims, 10 Drawing Sheets

SEMICONDUCTOR STRUCTURE AND MANUFACTURING METHOD THEREOF

BACKGROUND

High-voltage metal-oxide-semiconductor (HVMOS) devices are commonly used in many electrical devices, such as integrate circuits, power supplies, power management systems, or analog to digital converters.

Under high voltage operating condition, HVMOS with heavily-doped source/drain adopted an extended drain for withstanding strong breakdown behavior. For annealing with high temperature activation, doping profile for HVMOS became difficult to control. Therefore, extra STI or counter doping was commonly inserted between gate and drain. These structures significantly extend carrier's path and improve breakdown voltage behavior. However, it also leads to a large device size and complicated processes. Since size reduction of IC devices continues to improve through advance technologies, a large HVMOS transistor structure may complicate an overall device miniaturization process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
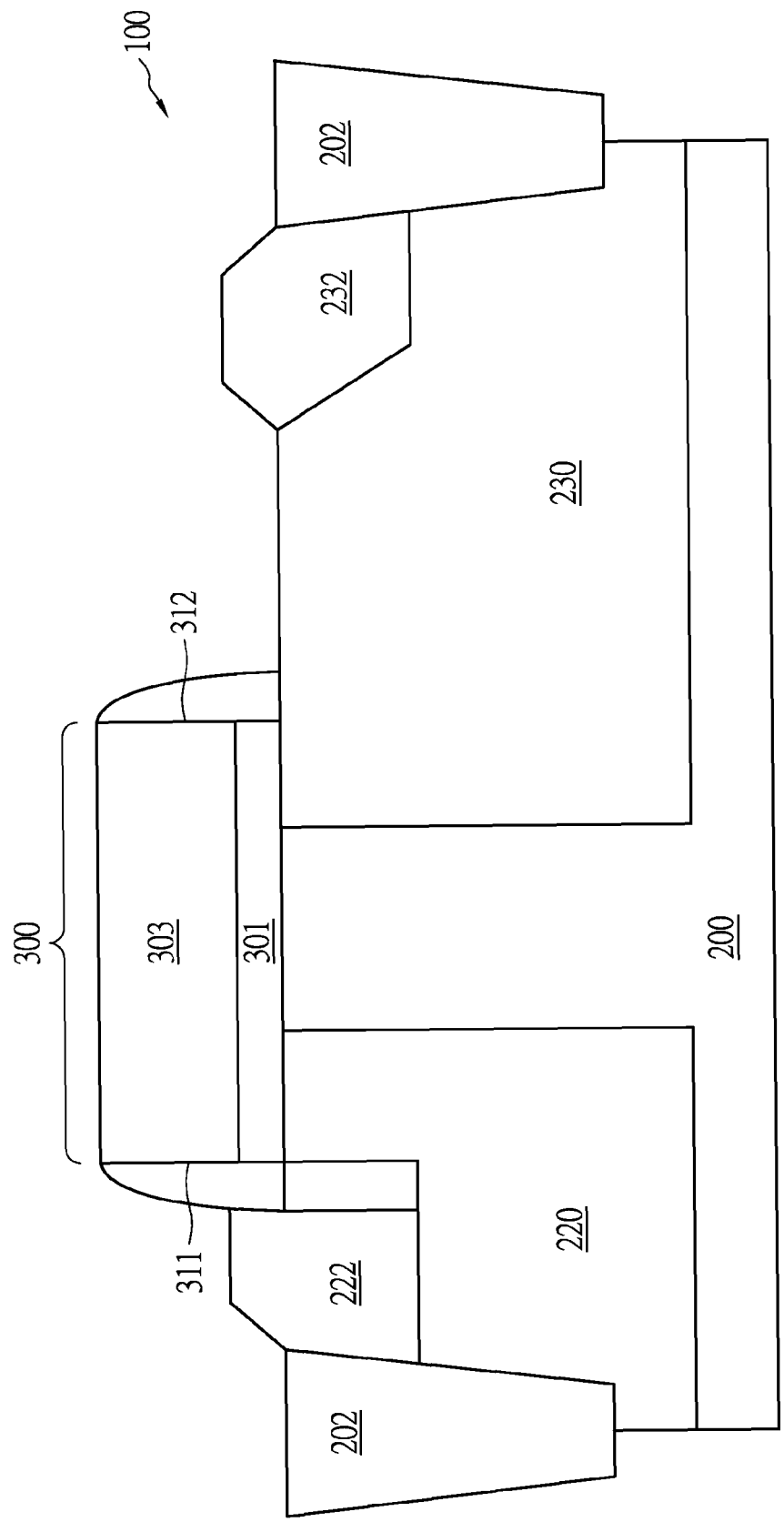
FIG. 1 is a cross sectional view of a high voltage semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor device may be fabricated in a CMOS technology process flow. It is noted that the semiconductor device may be designed as a system-on-chip (SoC) device having various PMOS and NMOS transistors that are fabricated to operate at different voltage levels. The PMOS and NMOS transistors may provide low voltage applications including logic or memory devices and input or output devices. On the other hand the PMOS and NMOS transistors may also offer high voltage application including power management devices. It is understood that the semiconductor device may also include resistors, capacitors, inductors, diodes, and other suitable microelectronic devices that are typically implemented in integrated circuits. In the present embodiment, the semiconductor device may be an n-type high voltage MOS (NHVMOS) device or a p-type high voltage MOS (PHVMOS). The NHVMOS device may be referred to as an n-type laterally diffused MOS (LDMOS) device. The PHVMOS device may be referred to as a p-type laterally diffused MOS (LDMOS) device. Since PHVMOS and NHVMOS may be process through different types of manufacturing, different combination of design may exist. For example, some semiconductor devices or circuit design may include NHVMOS with PMOS combination, while some other semiconductor devices or circuit design may include PHVMOS with NMOS combination. Still, some semiconductor devices may include both NHVMOS with PHVMOS integrated in a circuit individually.

In semiconductor manufacturing operations, impurities are added by ion implantation, followed by an annealing operation. During the annealing operation, high temperature may cause dopant to spread out and diffuse. This may refer to as an out-diffusion effect. For example, ion underwent high temperature during annealing may diffuse from a drain outward toward a substrate. Increase a distance between the drain and the gate may increase a resistivity between the drain and the gate. With large out-diffusion around the drain region after high temperature annealing, the drain shall be positioned even further away from a gate to avoid device breakdown. For example, structures such as doped region with opposite doping type, oxides, or epitaxial region that causing greater resistance can be formed in the well region between the gate and the drain to increase the breakdown voltage in a high voltage device.

FIG. 1 illustrates a cross-sectional view of a high voltage semiconductor device. The high voltage semiconductor device includes a substrate 200. In the present embodiment, the substrate 200 includes a p-type silicon substrate (P-substrate). To form a complementary HVMOS, an n-type buried layer, may be implanted deeply under an active region of a p-type HVMOS (PHVMOS) of the P-substrate (not shown). Substrate 200 may include a semiconductor material such as silicon, silicon germanium, or the like. Substrate 200 may be lightly doped with a p-type impurity, although it can also be doped with an n-type impurity.

In FIG. 1, a substrate 200 may be silicon-on-insulator (SOI) substrate. SOI substrates are fabricated using separation by implantation of oxygen (SIMOX), wafer bonding, and/or other suitable methods. Some exemplary substrates include an insulator layer. The insulator layer includes any suitable material, including silicon oxide, sapphire, other suitable insulating materials, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary FinFET precursors, the insulator layer is a component (e.g., layer) of a silicon-on-insulator substrate.

In FIG. 1, a substrate 200 may also include various isolation features 202 such as shallow trench isolation (STI) features or local oxidation of silicon (LOCOS) formed in the substrate 200 to separate various devices. The isolation feature 202 may be formed in the substrate 200 to define and electrically isolate various active regions as shown in FIG. 1. In the present embodiment, the isolation feature 202 may define a region for an NHVMOS device, a region for a core NMOS device, a region for a core PMOS device, a region for a PHVMOS device, and other regions for various microelectronic devices utilized in integrated circuits. It is understood that several processes disclosed below form corresponding features in some other active regions of the substrate 200 for some other types of devices. The isolation feature 202 may comprise silicon oxide, silicon nitride, silicon oxynitride, an air gap, other suitable materials, or combinations thereof.

In FIG. 1, a semiconductor device 100 may include a first well region 220 formed in a substrate 200 adjacent to the isolation feature 202. The semiconductor device 100 further includes a second well region 230 formed in the substrate 200 adjacent to some isolation features 202. The second well region 230 may be referred to as an extended drain or a drain extension well. The isolation feature 202 may set a boundary for the second well region 230 and the first well region 220. The second well region 230 and the first well region 220 may be a portion of the substrate 200, and may be formed by various ion implantation processes. Alternatively, the second well region 230 and the first well region 220 may be portions of an epitaxy layer such as a silicon epitaxy layer formed by epitaxy operations. In some embodiments, a semiconductor device 100 may be an n-type high voltage MOS NHVMOS device, and the second well region 230 may have an n-type dopant such as phosphorus, and the first well region 220 may have a p-type dopant such as boron. For example, for a PHVMOS device, the first well region 220 may have a first type of conductivity with an n-type dopant, and the second well region 230 may have a second type of conductivity with a p-type dopant. In one embodiment, the second well region 230 and first well region 220 may be formed by a plurality of operations, whether now known or to be developed, such as growing a sacrificial oxide on substrate 200, opening a pattern for a location(s) in the first well region 220 or the second well region 230, and implanting impurities. The substrate 200 may also include various doped regions depending on design specifications as known in an art (e.g., p-type wells or n-type wells). The doped regions are doped with p-type dopants, such as boron; n-type dopants, such as phosphorus or arsenic; or combinations thereof.

Figure 2:
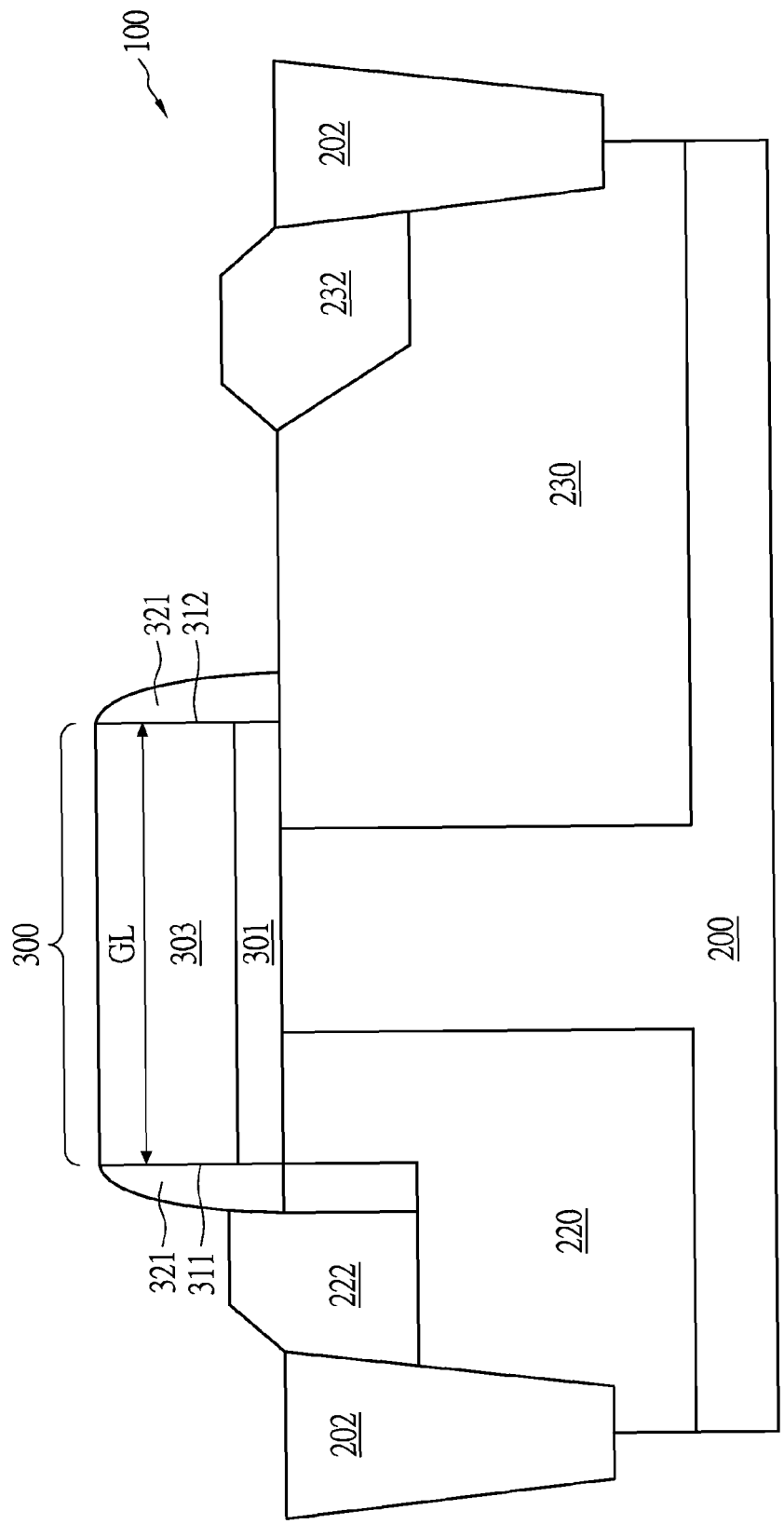
FIG. 2 is a cross sectional view of a high voltage semiconductor device, in accordance with some embodiments.

In FIG. 2, the semiconductor device 100 further includes a gate structure 300 disposed on the substrate 200. The gate structure 300 may include a gate dielectric 301 and a gate electrode in an upper portion 303 of the gate structure 300 formed on the gate dielectric 301. The gate structure 300 has boundaries from a first sidewall 311 of the gate structure 300 to a second sidewall 312 of the gate structure 300, opposite to the first sidewall 311 of the gate structure 300. The gate dielectric 301, which is a layer right above the substrate 200, may include a silicon oxide layer. Alternatively, the gate dielectric 301 may optionally include a high-k dielectric material, silicon oxide, silicon nitride, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, hafnium oxide, or combinations thereof. Examples of high-k dielectric material includes $HfO_2$, HfSiO, HfSiON, HfzrO, LaO, BazrO, HfLaO, HfSiO, LaSiO, AlSiO, HfTaO, HfTiO, zirconium oxide, aluminum oxide, other suitable high-k dielectric materials, and/or combinations thereof. The gate dielectric 301 may have a multilayer structure such as one layer of silicon oxide and another layer of high k material. One or more gate structure 300 may be formed over a substrate 200. The gate dielectric 301 may be formed over an interfacial layer by any suitable process.

In FIG. 2, in some embodiments, a gate structure 300 may be a metal gate, including conductive layers, diffusion/barrier layers, an interfacial layer, capping layers, a hard mask layer, a sealing layer, and other suitable structures, and/or combinations thereof. An interfacial layer may formed by any suitable process to any suitable thickness. An exemplary interfacial layer includes silicon oxide (e.g., thermal oxide or chemical oxide) and/or silicon oxynitride (SiON). The gate electrode is formed over the gate dielectric 301 by any suitable process. The gate electrode includes any suitable material, such as aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof. The hard mask layer may be formed over the gate electrode by any suitable process. The hard mask layer includes any suitable material, for example, silicon nitride, SiON, SiC, SiOC, spin-on glass (SOG), tetraethyl-orthosilicate (TEOS), plasma enhanced CVD oxide (PE-oxide), high-aspect-ratio-process (HARP) formed oxide, and/or other suitable material.

In FIG. 2, a gate structure 300 has a gate length GL measured horizontally from a first sidewall 311 of the gate structure 300 to a second sidewall 312 of the gate structure 300. The gate length GL may be in a range from about 0.25 to about 0.9 micrometers. The gate structure 300 may be asymmetrically disposed on the first well region 220 and the second well region 230. For instance, the gate structure 300 may have a first portion overlapping with the first well region 220 and a second portion overlapping with the second well region 230. The first sidewall 311 is close to the first well region 220, and the second sidewall 312 is close to the second well region 230.

Referring back to FIG. 2, sidewall spacers 321 may be formed adjacent to a first sidewall 311 and a second sidewall 312 of the gate structure 300. The sidewall spacers 321 may be laterally adjoining to the first sidewall 311 of the gate structure 300 and the second sidewall 312 of the gate structure 300. The sidewall spacer 321 may include a dielectric material such as silicon oxide. Alternatively, the sidewall spacer 321 may optionally include silicon nitride, silicon carbide, silicon oxynitride, or combinations thereof.

In some embodiments, the sidewall spacer 321 may have a multilayer structure. The gate structure 300 and the sidewall spacer 321 may act as an implant mask, and further source, drain, or lightly doped implants may be performed after forming a sidewall spacer 321.

Figure 3:
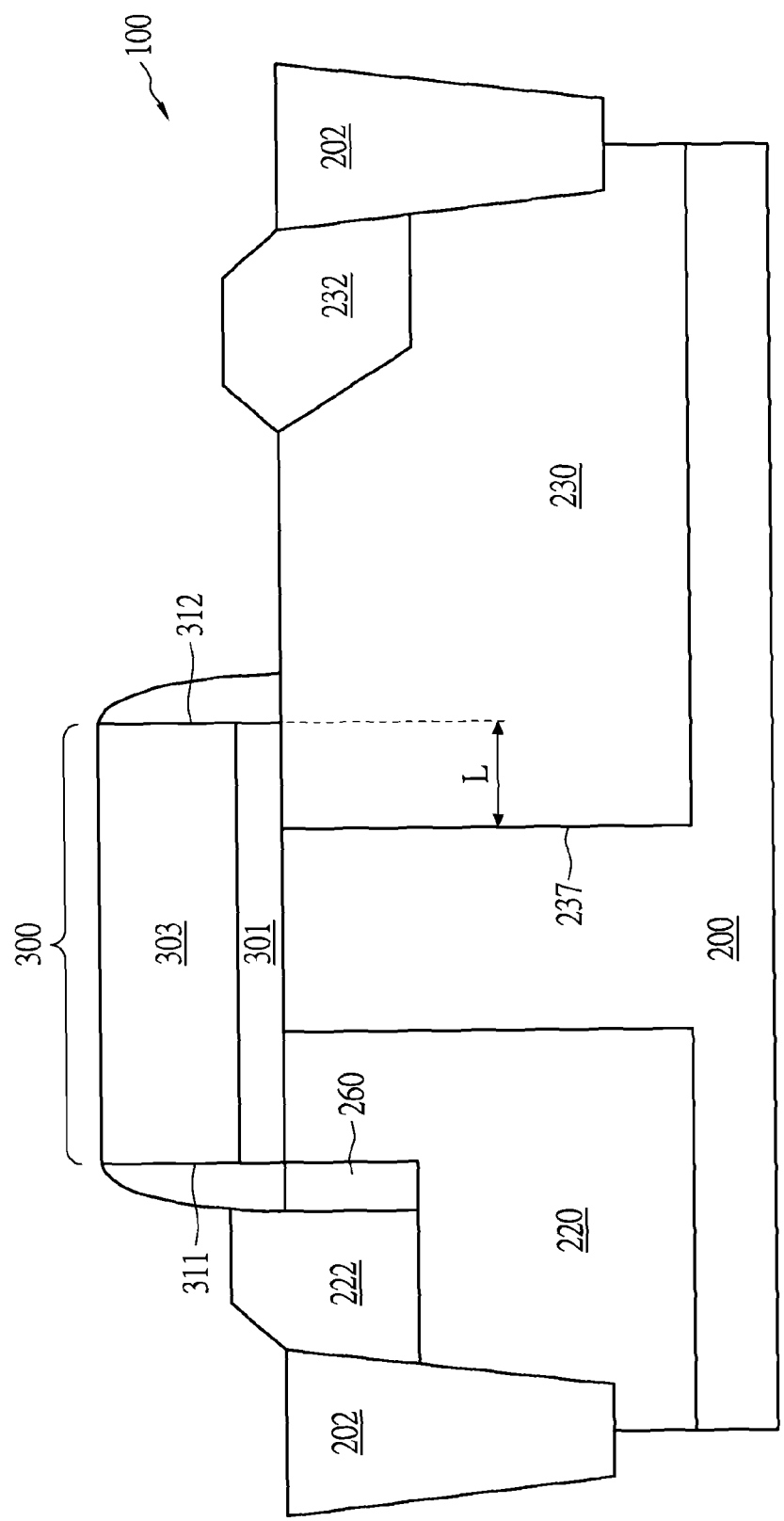
FIG. 3 is a cross sectional view of a high voltage semiconductor device, in accordance with some embodiments.

Referring to FIG. 3, the gate structure 300 overlaps with the second well region 230 by an overlapping length L. The overlapping length L is measured laterally from a boundary 237 of the second well region 230 to a second sidewall 312 of the gate structure 300. The overlapping length L could be in a range of from about 0.05 to about 0.25 micrometers.

Referring to FIG. 3, the boundary 237 is between the substrate 200 and the second well region 230. A dopant concentration in the substrate 200 and the second well region 230 may be different. A boundary 237 may be of various shapes. For example, in some embodiments, a boundary 237 may be vertical, slanted, or curved. The boundary 237 is underneath the gate structure 300.

Referring to FIG. 3, the semiconductor device 100 further includes a lightly doped region 260. For example, a semiconductor device 100 may be NHVMOS, having a lightly doped region 260 doped with n-type dopant. The lightly doped region 260 may be formed in a first well region 220 which may be a p-type well. Whereas for a semiconductor device of PHVMOS having a lightly doped region 260, the lightly doped region 260 could doped with p-type dopant. The lightly doped region 260 may also be formed in a first well region 220 which may be an n-type well. The lightly doped region 260 may have an edge substantially self-aligned to the first sidewall 311 of the gate structure 300. The lightly doped region 260 may include n-type dopant such as phosphorus or arsenic.

In FIG. 3, a conductive region may be formed in the first well region 220 and/or the second well region 230. In some embodiments, the conductive region in the first well region 220 is a source region 222. In other embodiments, the conductive region in the second well region 230 is a drain region 232. The source region 222 may be adjacent to an isolation feature 202 close to the first well region. The drain region 232 may be adjacent to an isolation feature 202 close to the second well region 230. A side of the source region 222 may laterally border the lightly doped region 260, one side of which is substantially aligned to the first sidewall 311 of the gate structure 300. In some embodiments, the conductive region may be an epitaxy region. For example, the semiconductor device 100 may have a drain region 232 made of epitaxial materials and a source region 222 made of heavily doped semiconductor substrate. In other embodiments, the semiconductor device 100 may have both the drain region 232 and the source region 222 made of epitaxial materials.

Figure 4:
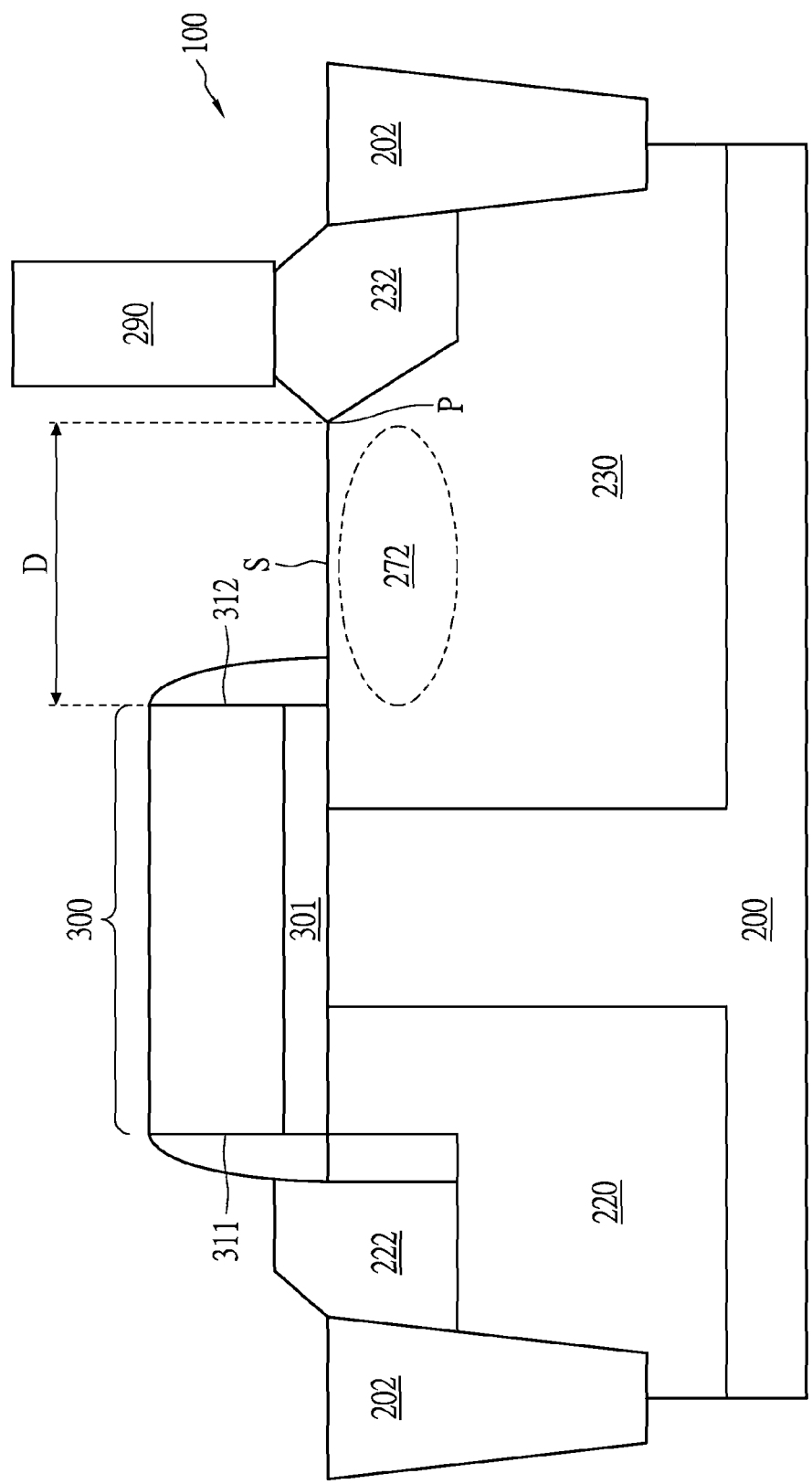
FIG. 4 is a cross sectional view of a high voltage semiconductor device, in accordance with some embodiments.

In FIG. 4, a source region 222 in FIG. 3 or a drain region 232 in FIG. 3 may be an epitaxy region. The epitaxy region in FIG. 4 is partially disposed in the substrate 200 with some portion of epitaxy region below a surfaces S of the substrate 200 and some portion above the surface S, this may be referred to as a raised structure. The epitaxy region may be at least one of the source region 222 or the drain region 232. For a PHVMOS semiconductor device, an epitaxy region may compose SiGe material. SiGe material may have a lattice constant greater than a lattice constant of a substrate 200. An epitaxy region composed of SiGe is known to create a compressive uni-axial stress in a channel region (not shown) between the drain region 232 and the source region 222. The compressive uni-axial stress may be caused by a lattice mismatch between SiGe in the epitaxy region and some material in the first well region 220 or the second well region 230. One skilled in the art will realize a respective principle could be applied for a NHVMOS semiconductor device. For the NHVMOS semiconductor device, an epitaxy region may compose SiP with stress-memorized dislocation. An epitaxy region composed of stress-memorized SiP having dislocations is known to create a tensile uni-axial stress in a channel region (not shown) between the drain region 232 and the source region 222. A uni-axial stress may increase carrier mobility and thus improves a transistor performance. The drain region 232 in FIG. 4, with epitaxy structure instead of doped implantation may reduce out-diffusion effect. The out-diffusion effect is caused by annealing the implanted ions within a drain region 232. Ion underwent high temperature during annealing may diffuse from drain region 232 outward toward a second well region 230. In some embodiments, epitaxy region may be in situ doped with dopant without high temperature annealing. Therefore, out-diffusion effect may be reduced by having an epitaxy region. With constraint on out-diffusion, hot electron effect or other voltage breakdown mechanism may also be limited. Issues for reliability concerns may be relatively reduced. Using an epitaxy structure to restraint out-diffusion may permit a high voltage operation.

Referring to FIG. 4, with a limitation on out-diffusion, a separation region 272 in a second well region 230 between the drain region 232 and the gate structure 300 may be essentially homogeneous with other material throughout a rest of the second well region 230. The separation region 272 is in the rest of the second well region 230. When a high voltage is applied to a drain region 232, which can be an epitaxy region, carriers would travel from the epitaxy region, through the separation region 272, to the source region 222. Chemical composition in and around the separation region 272 may be homogeneous with material throughout the rest of the second well region 230. Dopant may not out-diffuse from the epitaxial drain region 232 to the separation region 272, and thus dopant concentration profile throughout second well region 230 may be homogeneous. In an embodiment, within the second well region 230, the drain region 232 may be spaced apart from the second sidewall 312 of the gate structure 300 by the separation distance D, as shown in FIG. 4. The separation distance D is measured horizontally at a surface S of the substrate 200. The separation distance D is measured along the surface S, from a second sidewall 312 of the gate structure 300 to a junction point P. The junction point P is the point where the epitaxy region, or the drain region 232, and the second well region 230 meet on the surface S. The separation distance D may be in a range of from about 0.2 micrometers to about 0.5 micrometers. With epitaxial drain region 232, less dopant may out-diffuse to the separation region 272 and the second well region 230. In some embodiments, separation distance D is around 0.2 micrometers. By reducing the separation distance D, overall miniaturization of a HVMOS is improved. Similarly, for an epitaxial source region 222, dopant out-diffusion may be reduced in the first well region 220.

In FIG. 4, altering SiGe or SiP concentration profile in an epitaxial source region 222 or an epitaxial drain region 232 may control a current gain or a leakage current level of a semiconductor device 100. For example, a uniform or gradient concentration profile of SiGe or SiP may be applied to an epitaxy region. Different SiGe or SiP concentration profile of the epitaxy region may be adjusted for variety of application purposes. An epitaxy region may also be doped. For PHVMOS or PMOS semiconductor device, a p-type dopant such as boron could be added to the epitaxy region.

For NHVMOS or NMOS semiconductor device, an n-type dopant such as phosphor could be added to the epitaxy region. A concentration of dopant in an epitaxy region could be more than other concentrations of dopant in a first well region 220 or a second well region 230. A concentration profile of dopant within an epitaxy region may also be adjusted. An epitaxy region may be a raised structure to achieve low contact resistance by effectively increases surface areas of the source region 222 and the drain region 232 and therefore lowers a sheet resistance.

Referring to FIG. 4, a contact plug 290 may be disposed on top of an epitaxy region. The contact plug 290 is for connecting a source region 222 or a drain region 232 to several components or devices electrically. For example, a plurality of patterned dielectric layers and conductive layers are formed on a substrate 200 to form multilayer interconnects configured to couple some various p-type and n-type doped regions, such as a source region 222, a drain region 232, contact region, and gate electrode. In one embodiment, an interlayer dielectric (ILD) and a multilayer interconnect (MLI) structure are formed in a configuration such that the ILD separates and isolates each metal layer from other metal layers of the MLI structure. In furtherance of the example, the MLI structure includes contacts, vias and metal lines formed on the substrate 200. In one example, the MLI structure may include conductive materials such as aluminum, aluminum/silicon/copper alloy, titanium, titanium nitride, tungsten, polysilicon, metal silicide, or combinations thereof, being referred to as aluminum interconnects. The ILD material includes silicon oxide. Alternatively or additionally, the ILD includes a material having a low dielectric constant. In one embodiment, the dielectric layer includes silicon dioxide, silicon nitride, silicon oxynitride, polyimide, spin-on glass (SOG), fluoride-doped silicate glass (FSG), carbon doped silicon oxide, Xerogel, Aerogel, amorphous fluorinated carbon, Parylene, BCB (bis-benzocyclobutenes), polyimide, and/or other suitable materials.

Figure 5:
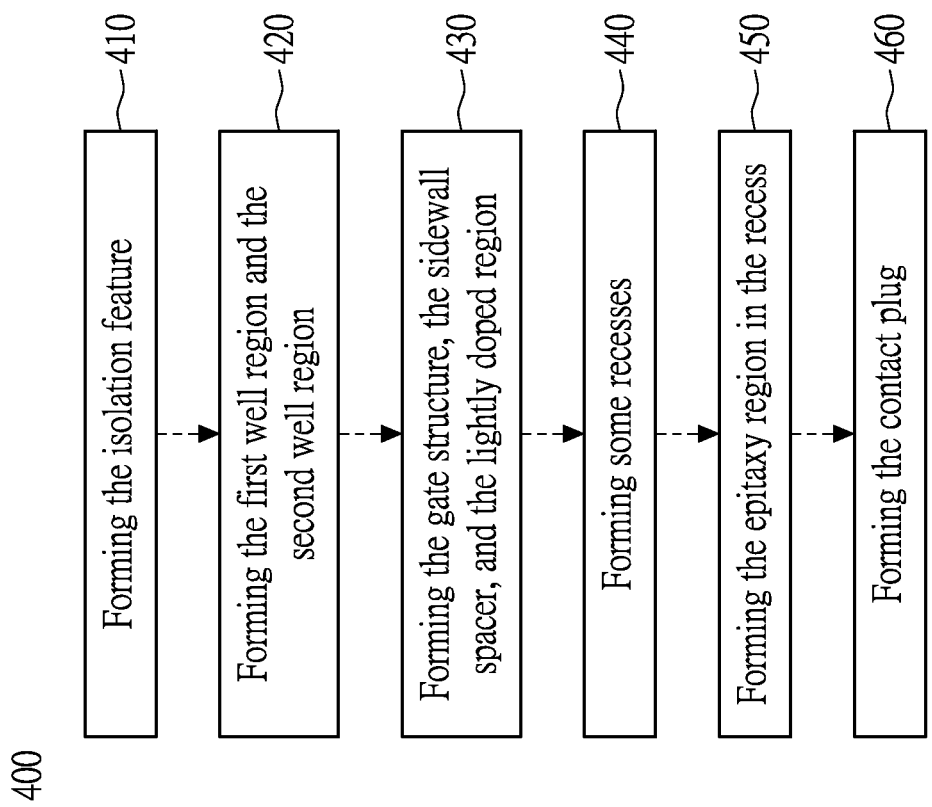
FIG. 5 is an operational flow of a method for manufacturing a high voltage semiconductor structure, in accordance with some embodiments.

FIG. 5 is a flow chart about several manufacture operations. The structures recited below with numeral labels are identical or their equivalents to those structures are shown in previous figures. Operation 410 is about forming the isolation feature 202, also shown in FIG. 6. Operation 420 is about forming the first well region 220 and the second well region 230, also shown in FIG. 7. Operation 430 is about forming the gate structure 300, the sidewall spacer 321, and the lightly doped region 260, also shown in FIG. 8. Operation 440 is about forming some recesses 280, also shown in FIG. 9. Operation 450 is about forming the epitaxy region in the recess, also shown in FIG. 10. Operation 460 is about forming the contact plug 290 over the drain region, also shown in FIG. 10.

Figure 6:
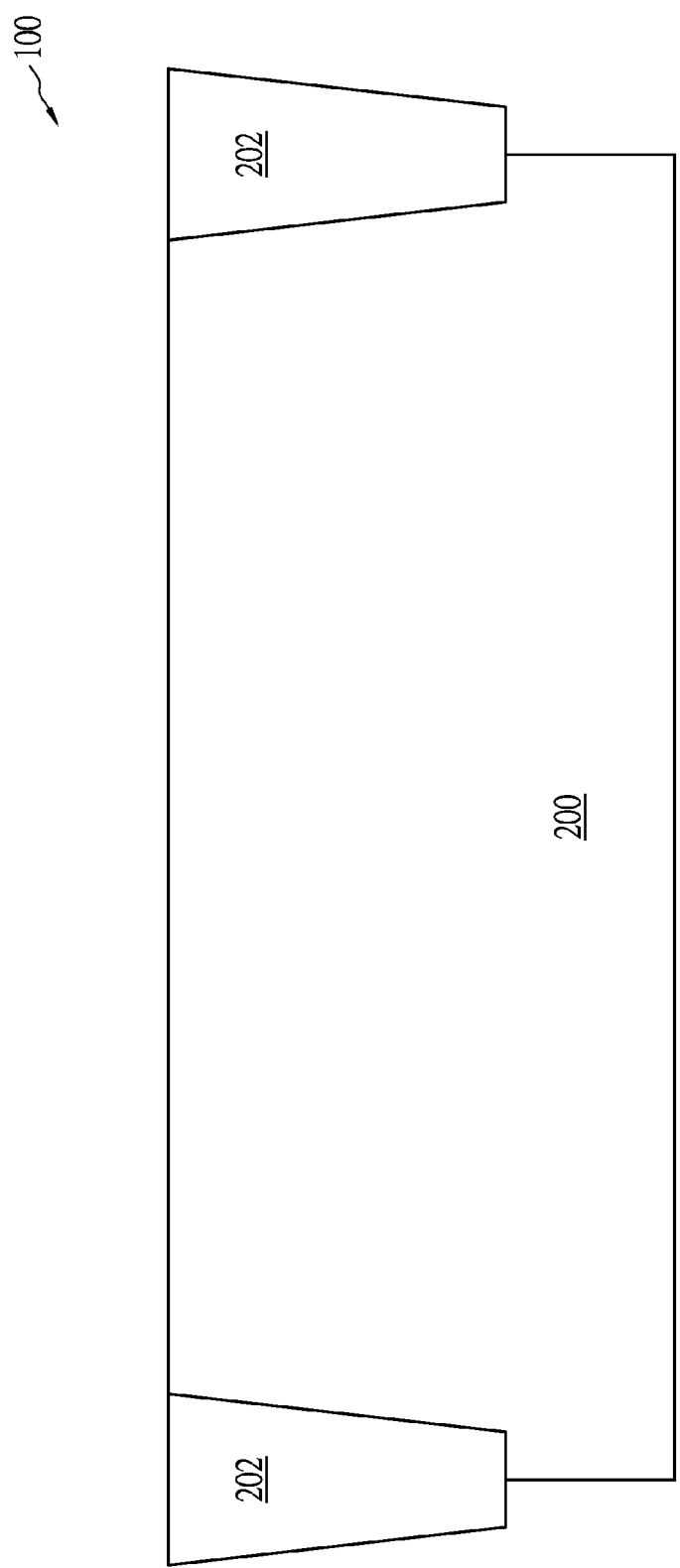
FIG. 6 to FIG. 10 are cross sectional views of operations of a method for manufacturing a high voltage transistor with two epitaxy regions and a gate structure in between, in accordance with some embodiments of the present disclosure.

FIG. 6 is about forming the isolation feature 202, referring back to the operation 410 in FIG. 5. Referring to FIG. 6, several solation features 202 such as shallow trench isolation (STI) or local oxidation of silicon (LOCOS) are formed in the substrate 200 before several formations of other active regions. The formations of other active regions may include operation 420 to operation 460. In one example, a formation of a STI feature may include dry etching a trench in a substrate 200 and filling the trench with insulator materials such as siliconoxide, silicon nitride, high-density plasma (HDP) oxide, or silicon oxynitride. The filled trench may have a multi-layer structure such as a thermal oxide liner layer filled with silicon nitride or silicon oxide. In furtherance of the embodiment, the STI feature may be created using a processing sequence such as: growing a pad oxide, forming a low pressure chemical vapor deposition (LPCVD) nitride layer, patterning the STI opening using photoresist and masking, etching a trench in the substrate 200, optionally growing a thermal oxide trench liner to improve the trench interface, filling the trench with oxide, using chemical mechanical polishing (CMP) processing to etch back and planarize, and using a nitride stripping process to remove the silicon nitride. In the present embodiment, the isolation feature 202 may define a region for an NHVMOS device, a region for a core NMOS device (not shown), a region for a core PMOS device (not shown), a region for a PHVMOS device (not shown), and other regions for various microelectronic devices utilized in integrated circuits. The isolation feature 202 may also be formed after several formations of other active regions. This includes forming a mask layer, preferably comprising SiN, over other active regions. The mask layer is then patterned to form openings. A local oxidation is then performed, and insulation regions (field oxides) are formed in the openings. The mask layer is then removed. In the above embodiments, for example, insulation regions may be formed after the formation of other active region such as a first well region 220 or a second well region 230.

Figure 7:
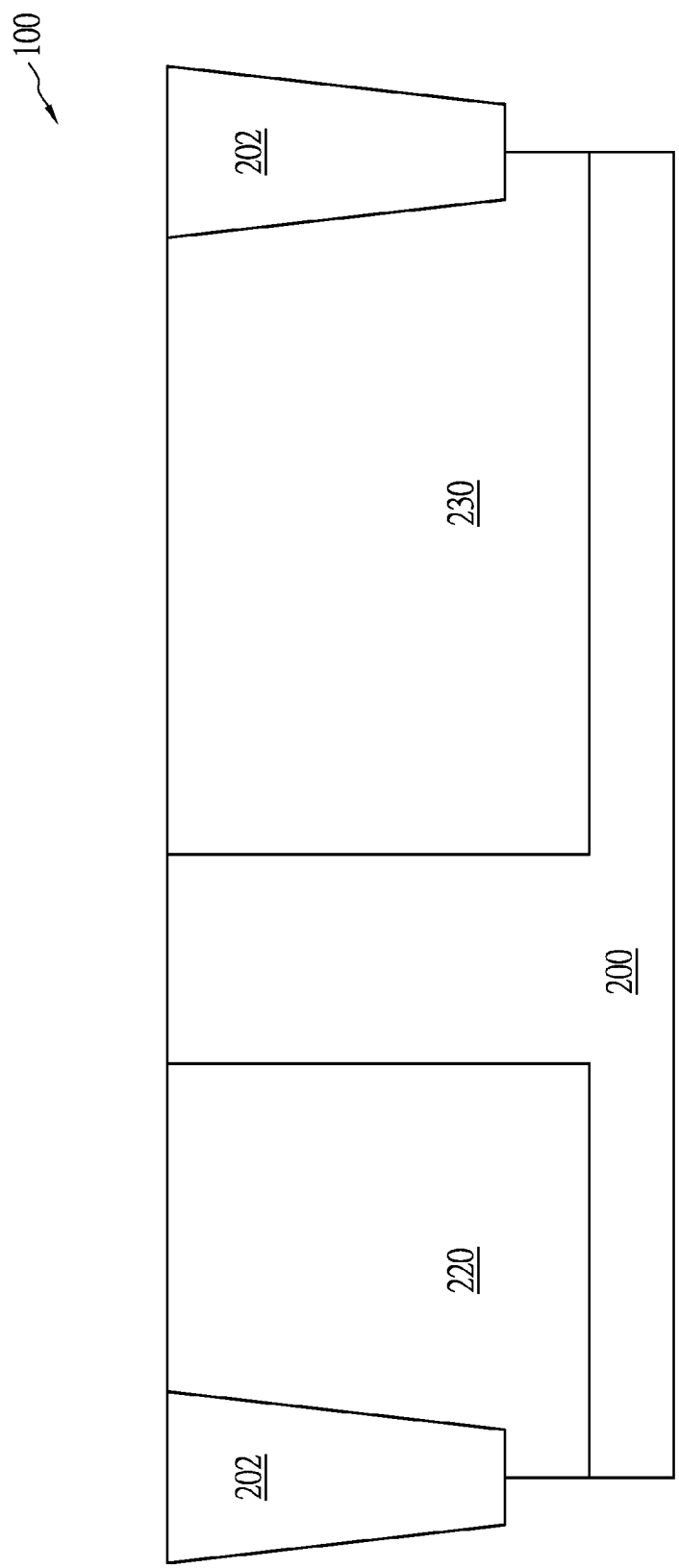

FIG. 7 is about forming the first well region 220 and the second well region 230, referring back to the operation 420 in FIG. 5. Referring to FIG. 7, a formation of a first well region 220 and a second well region 230 may follow after the formation of the isolation features 202. Both well regions may be either n-type or p-type by ion-implantation or diffusion techniques known in the art. For example, a mask is used to pattern a photoresist layer in a photolithography process or other suitable process. An exemplary photolithography process may include processing steps of photoresist coating, soft baking, mask aligning, exposing, post-exposure baking, developing, and hard baking. An ion implantation utilizing an n-type dopant such as arsenic or phosphorus, may be performed to form an n-type well region in the substrate 200. An ion implantation utilizing a p-type dopant, such as boron, may be performed to form a p-type well region. The p-type well region may be formed in a similar manner as discussed above for the n-type well region. A mask is used to pattern a photoresist layer that protects the n-type well so that while p-type well region is been implanted, the n-type well region remains the same. It is noted that other ion implantation processes may also be performed to adjust threshold voltages of a NHVMOS and a PHVMOS devices in some other active regions of the substrate as is known in the art. For example, for an NHVMOS, photoresist is formed to cover a future p-type well region in a first well region 220, while future n-type well region in a second well region 230 is exposed. An implantation is then performed to introduce an n-type impurity, such as arsenic, phosphorous and the like into the second well regions. After the implantation of one of the n-type well region, photoresist is removed. Then, an additional photoresist is formed to cover the n-type well region in the second well region 230, while the future p-type well regions are exposed. An implantation is then performed to introduce a p-type impurity, such as boron, indium and the like into the p-type well regions. An order of implantation could be reverse, such as first doping with a p-type impurity follow by an n-type impurity. An impurity concentration of an n-type well region may be higher, lower, or the same with a p-type well region. Several depths of these well regions are controlled by appropriate implantation energies. For PHVMOS, conductivity type in a first well region 220 and a second well region 230 would be opposite than that of the NHVMOS. The first well region 220 would have an n-type dopant, while a second well region 230 would have a p-type dopant.

Figure 8:
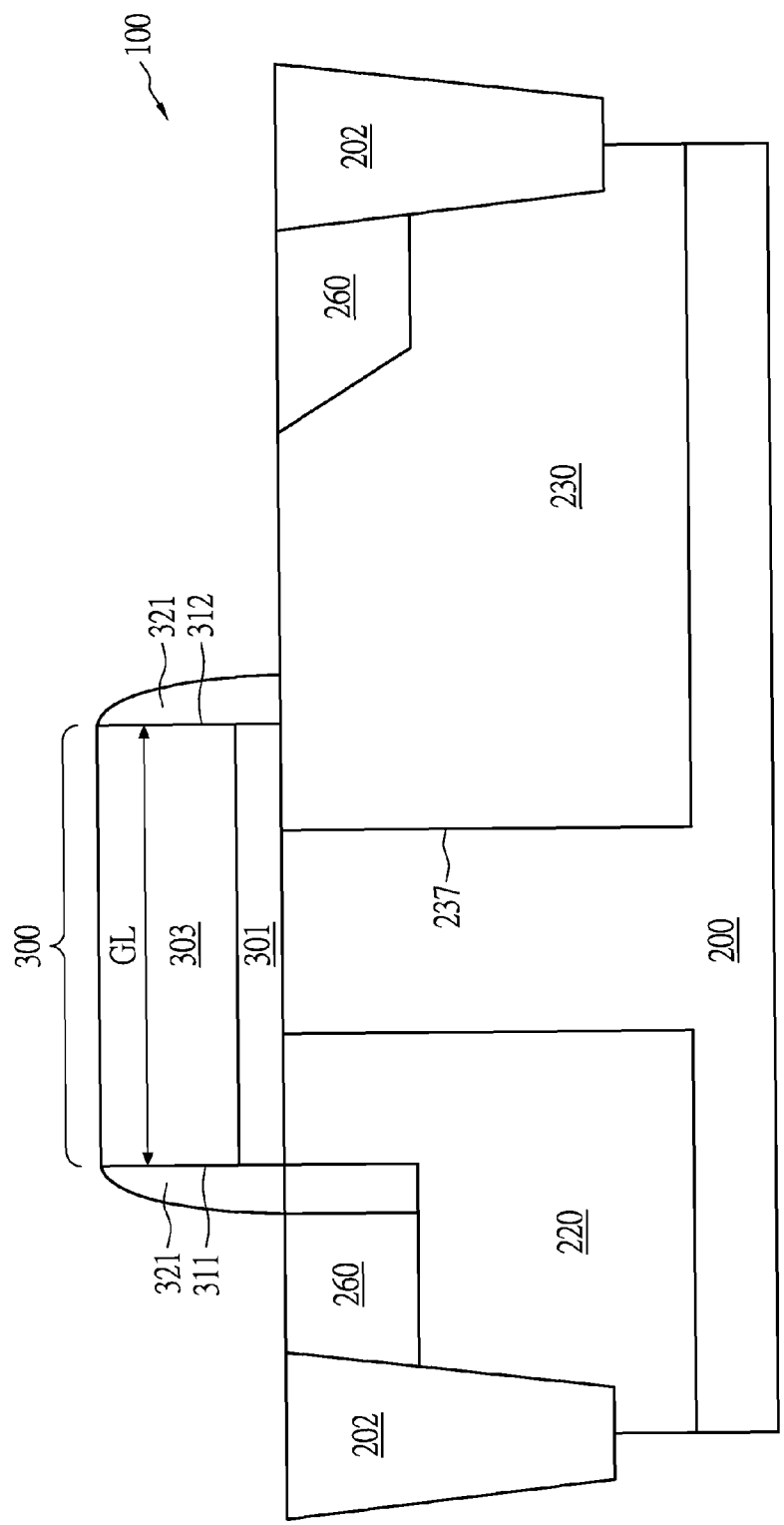

In FIG. 8, the second well region 230 may be doped by ion-implantation or diffusion technique. Dopant concentration in the second well region 230 and a substrate 200 would be different. Between the substrate 200 and the second well region 230 is a boundary 237. The boundary 237 is defined by a difference in doping concentration between the substrate 200 and the second well region 230. In some embodiments, after ion-implantation or diffusion technique, the second well region 230 may be of various shapes. The boundary 237 may also be in various shapes corresponding to the shapes of the second well region 230. The second well region 230 may have a shape of a polygon with sharp edges, or a polygon with smooth edges. The boundary 237 may be vertical, slanted, or curved. A gate structure 300 may be formed over the boundary 237 such that the gate structure 300 is over both the substrate 200 and the second well region 230.

FIG. 8 shows the formation of the gate structure 300, the sidewall spacer 321, and the lightly doped region 260, referring back to the operation 430 in FIG. 5. Referring to FIG. 8, after a formation of a first well region 220 and a second well region 230, a gate structure 300 could be formed. Since the gate structure 300 has some portion overlapping with the first well region 220 and some other portion overlapping the second well region 230, the gate structure 300 is form after a completion of these well regions. The gate structure 300 includes a gate dielectric 301, which is closest to the substrate 200. The gate dielectric 301 may be formed using chemical vapor deposition (CVD), physical vapor deposition (PVD), atomic layer deposition (ALD), thermal oxide, other suitable processes, or combinations thereof. On top of the gate dielectric 301 may be a dummy polysilicon. The dummy polysilicon may then be removed to allow a gate electrode to be formed at an upper portion 303 of the gate structure 300, on top of the gate dielectric 301. For example, a dummy polysilicon layer may be form over a gate dielectric layer 301. A layer of photoresist is formed on the dummy polysilicon layer by a suitable process, such as spin-on coating, and then patterned to form a patterned photoresist feature by a proper lithography patterning method. The pattern of the photoresist can then be transferred by a dry etching operation to the underlying dummy polysilicon layer and gate dielectric layer. The pattern of the photoresist could have an opening with width of a gate length GL for a formation of the gate structure 300. Thus leftover gate dielectric layer and dummy polysilicon would define a boundary for a gate structure 300. In an embodiment, only the dummy polysilicon layer is patterned. The photoresist layer may be stripped thereafter. In another embodiment, some sidewall spacers 321 may be form first on either side of a leftover dummy polysilicon. Then, the dummy polysilicon is etched away. A metal gate electrode could then be formed between the sidewall spacers to replace the dummy polysilicon. In some embodiments, the metal gate electrode may also be in a layered structure. The metal gate electrode layer may be formed by CVD, PVD, plating, and other proper processes. The metal gate electrode may have a multilayer structure and may be formed in a multiple-step operation using a combination of different procedures. The metal gate electrode, which is at an upper portion 303 of the gate structure 300, may be configured to be coupled to metal interconnects or a contact plug 290.

In FIG. 8, the sidewall spacer 321 may be formed by a deposition and etching (e.g., anisotropic etching technique) as is known in the art. Sidewall spacer 321 may be formed using commonly used techniques, such as plasma enhanced chemical vapor deposition (PECVD), low-pressure chemical vapor deposition (LPCVD), sub-atmospheric chemical vapor deposition (SACVD), or the like. A formation of sidewall spacer 321 may include blanket forming several sidewall spacer layers, and then performing an etching operations to remove a horizontal portions of the sidewall spacer layers, so that a remaining vertical portions of the sidewall spacer layers could be formed. The sidewall spacers 321 may be form adjacent to a first sidewall 311 and a second sidewall 312 of the gate structure 300.

In FIG. 8, a semiconductor device 100 may also be a PHVMOS device and various core NMOS and PMOS devices formed in other active regions of a substrate 200. Accordingly, the lightly doped region 260 may be formed concurrently with a formation of other lightly doped region of a same type in some other active regions of the substrate 200 for the NMOS devices. The lightly doped region 260 may be formed by ion implantation or diffusion. It should be noted that the first well region 220 and the second well region 230 may be protected with a patterned photoresist layer during formation of the lightly doped region 260. The lightly doped region 260 may be formed close to some isolation features 202.

Figure 9:
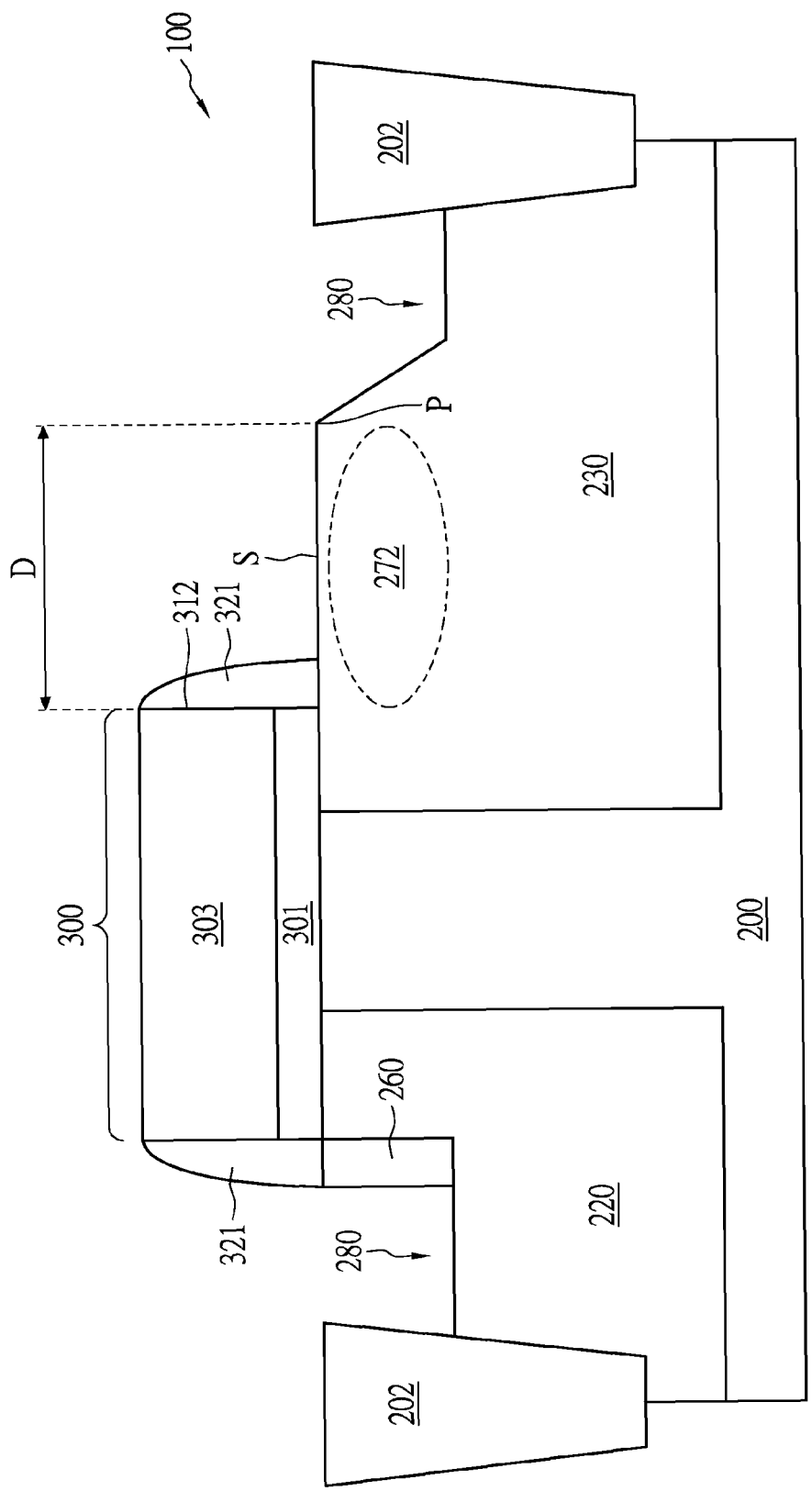

FIG. 9 shows the formation of recess 280, referring back to the operation 440 in FIG. 5. In FIG. 9, an etching operation is performed to form recesses 280 in the source region 222 and the drain region 232. In some embodiments, a portion of the lightly doped region 260 is removed as shown in the source in the first well region 220. Some remaining portion of the lightly doped region 260 in the first well region 220 may be left underneath the sidewall spacer 321. In a second well region 230, the lightly doped region 260 may be substantially removed, leaving a thin film of lightly doped film (not shown) lying in the recess 280 of the second well region 230. A patterned photoresist is formed to define the recess 280 in the first well region 220 and the second well region 230. To define a recess 280 in the second well region 230, a hard mask (not shown) may cover the surface S above the separation region 272. The hard mask may cover the separation distance D. Where D is defined from a second sidewall 312 of the gate structure 300 to a junction point P. An etching operation may include a dry etching, a wet etching, or the combination thereof. In the present embodiment, the etching operation includes a dry etching utilizing a combination of HBr or He gas. Adjustment could be made on different parameters such as pressure range, power range, bias voltage range, and gas flow rate range to control depth or shape of the recess 280. The dry etching removes a portion of the lightly doped regions 260 that are unprotected or exposed. In some embodiments, the recess 280 in a well without the separation region 272, that is, the first well 220 in FIG. 9, may have a sidewall that is aligned with one of the spacers 321 by a directional/anisotropic etch. The recess 280 in the well with the separation region 272, such as the second well region 230, demonstrates an inclined trench wall as a result of faceting during the etch. In other embodiments, a pre-cleaning process may be performed to clean the recess 280 with suitable solution.

Figure 10:
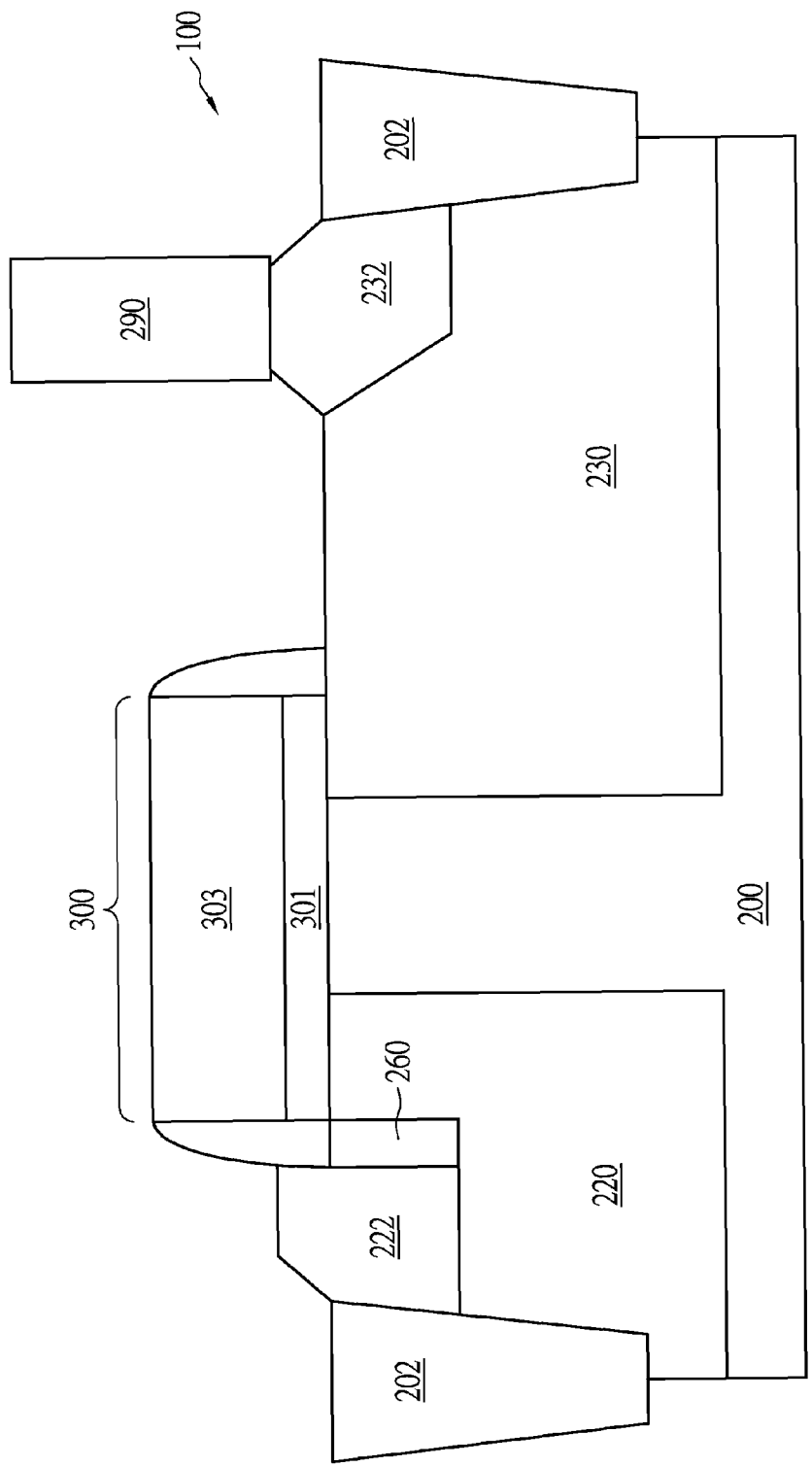

FIG. 10 shows the formation of the epitaxy region in the recess 280, referring back to the operation 450 in FIG. 5. Referring to FIG. 10, a semiconductor material, such as silicon germanium (SiGe), is epitaxially grown in the recess 280 to form epitaxy region by a selective epitaxial growth (SEG). Operations such as epitaxial growth of SiGe or other forms of disposing SiGe into some recesses 280 in FIG. 9 may also be used. An epitaxial process used to deposit an embedded stressor layers in source/drain regions may include chemical vapor deposition, ultra-high vacuum chemical vapor deposition (UHV-CVD), or molecular beam epitaxy (MBE). Desired impurities may be doped while an epitaxial growth proceeds. In an embodiment, impurities are added to epitaxy region during a growth (e.g., in-situ doping). Exemplary dopants include arsenic, phosphorous, antimony, boron, boron di-fluoride, and/or other possible impurities. Sources for boron include diborane gas used during SiGe epitaxy. Methods other than epitaxial growth of embedded stressor may be implemented in accordance with an illustrative embodiment. Boron doped in a SiGe may be accomplished by introducing boron-containing gas, in an in-situ fashion, to an epitaxial SiGe growth. Boron or other dopants may also be formed by implantation operations.

Referring to FIG. 10, in some embodiments, the epitaxy regions 222 and 232 can be formed over a stress-memorized layer that is pre-treated with stress memorization technique (SMT). As shown in FIG. 10, the stress-memorized layer can be an upper region of the first well region 220 and the second well region 230. For example, the epitaxy regions 222 and 232 may be formed in the recess 280 (see FIG. 9) and completed as a raised epitaxy region. Dislocations with predetermined orientations are formed in the epitaxy regions 222 and 232. In some embodiments, the epitaxy region is composed of SiP, the dislocations may exist only in the epitaxy region or may be continuously crossing some borders of the epitaxy regions 222, 232 and the stress-memorized layer.

In some embodiments of a CMOS structure, only a NHVMOS or a PHVMOS has an epitaxy region. For example, the PHVMOS has SiGe epitaxy source/drain but the NHVMOS has a planar SMT source/drain. In other embodiments, both the NHVMOS and PHVMOS have an epitaxy region. For example, the PHVMOS has SiGe epitaxy source/drain and the NHVMOS has SiP epitaxy source/drain over a stress-memorized layer. Embodiments discussed above are intended to limit the scope of the present disclosure. Other combinations regarding the existence of the epitaxy region in the NHVMOS and/or the PHVMOS are encompassed in the contemplated scope of the present disclosure.

FIG. 10 shows the formation of a contact plug 290 over the epitaxy region, referring back to the operation 460 in FIG. 5. In FIG. 10, after the forming of the epitaxy region, Back-End-Of-Line (BEOL) processes are then performed to form an Inter-Layer Dielectric (ILD, not shown). Contact plug 290 is formed on top of the epitaxy region. Contact plug 290 may be formed in an ILD and electrically coupled to NHVMOS device and PHVMOS device. An interconnect structure (not shown) including metal lines in Inter-Metal Dielectrics (IMDs, not shown) is then formed over and coupled to the contact plugs 290.

Some embodiments of the present disclosure provide a semiconductor device including a substrate and a gate structure on the substrate. A first well region of a first conductivity type is in the substrate, close to a first sidewall of the gate structure. A second well region of a second conductivity type is also in the substrate close to the second sidewall of the gate structure. A conductive region is disposed in the second well region. The conductive region is an epitaxy region. A chemical composition inside the second well region between the conductive region and the gate structure is essentially homogeneous as a chemical composition throughout the second well region.

In some embodiments of the present disclosure, the epitaxy region is connected with a contact plug.

In some embodiments of the present disclosure, the substrate includes a surface. The surface includes a junction point. The junction point is between the second well region and the epitaxy region. The junction point is spaced apart from a second sidewall of the gate structure by a separation distance of from about 0.2 to about 0.5 micrometers.

In some embodiments of the present disclosure, the gate structure on the substrate includes a gate length of from about 0.25 to about 0.9 micrometers.

In some embodiments of the present disclosure, the gate structure includes an overlapping length with the second well region. The overlapping length is from a boundary of the second well region to the second sidewall of the gate structure. The overlapping length is from about 0.05 to about 0.25 micrometers.

In some embodiments of the present disclosure, the gate structure includes a metal gate.

In some embodiments of the present disclosure, the epitaxy region includes a substance with a first lattice constant different from a second lattice constant of the substrate.

In some embodiments of the present disclosure, a portion of the epitaxy region is raised above a surface of the substrate.

Some embodiments of the present disclosure provide a method for fabricating a semiconductor device. The method includes providing a substrate and forming a gate structure on the substrate; forming a first well region, including a first conductivity type, in the substrate; forming a second well region, including a second conductivity type, in the substrate; forming a recess in at least one of the first well region and the second well region; forming a conductive region by an epitaxial growth in the recess. A chemical composition inside the second well region between the conductive region and the gate structure is substantially homogeneous with a chemical composition throughout the second well region.

In some embodiments of the present disclosure, including forming a contact plug above the conductive region.

In some embodiments of the present disclosure, the forming the conductive region includes disposing the conductive region from about 0.2 to about 0.5 micrometers away from a second sidewall of the gate structure.

In some embodiments of the present disclosure, the forming the conductive region includes forming a substance with a first lattice constant larger than a second lattice constant of the substrate.

In some embodiments of the present disclosure, the forming the conductive region includes forming an epitaxy region with dislocations over a stress-memorized layer.

Some embodiments of the present disclosure provide a semiconductor device including a substrate. A first well region of a first conductivity type is in the substrate. A second well region of a second conductivity type is also in the substrate. A gate structure is on the substrate. The gate structure includes a first sidewall close to the first well region and a second sidewall close to the second well region. A conductive region is disposed in the second well region. The conductive region is an epitaxy region. A separation region of the second well region is between the epitaxy region and the gate structure. A separation region is essentially homogeneous with other parts of the second well region.

In some embodiments of the present disclosure, the epitaxy region is a raised structure.

In some embodiments of the present disclosure, a contact plug is disposed on top of the epitaxy region.

In some embodiments of the present disclosure, the epitaxy region is located from the second sidewall by a separation distance of from about 0.2 to about 0.5 micrometers.

In some embodiments of the present disclosure, the first well region comprises an epitaxy region.

In some embodiments of the present disclosure, the gate structure includes a gate length of from about 0.25 to about 0.9 micrometers.

In some embodiments of the present disclosure, the gate structure is overlapping with the second well region. An overlapping length is from a boundary of the second well region to the second sidewall of the gate structure. The overlapping length is from about 0.05 to about 0.25 micrometers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a gate structure on the substrate;
a first well region of a first conductivity type in the substrate, positioning in proximity to a first sidewall of the gate structure;
a second well region of a second conductivity type in the substrate, positioning in proximity to a second sidewall of the gate structure, the second sidewall being opposite to the first sidewall;
a conductive region disposed in the second well region, the conductive region being an epitaxy region; and
a metal silicide fully covering a top surface of the conductive region,
wherein a chemical composition inside the second well region between the conductive region and the gate structure is essentially homogeneous as a chemical composition throughout the second well region,
wherein the substrate comprises a surface on which a junction point between the second well region and the epitaxy region is spaced apart from a second sidewall of the gate structure by a separation region, a separation distance of the separation region being from about 0.2 to about 0.5 micrometers.

2. The semiconductor device of claim 1, wherein the epitaxy region is connected with a contact plug.

3. The semiconductor device of claim 1, wherein the gate structure on the substrate comprises a gate length of from about 0.25 to about 0.9 micrometers.

4. The semiconductor device of claim 3, wherein the gate structure comprises an overlapping length with the second well region, the overlapping length being from a boundary of the second well region to the second sidewall of the gate structure, and wherein the overlapping length is from about 0.05 to about 0.25 micrometers.

5. The semiconductor device of claim 1, wherein the gate structure comprises a metal gate.

6. The semiconductor device of claim 1, wherein the epitaxy region comprises a substance with a first lattice constant different from a second lattice constant of the substrate.

7. The semiconductor device of claim 1, wherein a portion of the epitaxy region is raised above a surface of the substrate.

8. The semiconductor device of claim 1, wherein the semiconductor device is a high-voltage metal-oxide-semiconductor (HVMOS).

9. The semiconductor device of claim 1, further comprising:
a conductive region in the first well region; and
a lightly doped region adjacent to the conductive region in the first well region and in proximity to the first sidewall of the gate structure.

10. The semiconductor device of claim 1, wherein the epitaxy region comprises silicon germanium or silicon phosphide.

11. A semiconductor device, comprising:
a substrate;
a first well region of a first conductivity type, disposed in the substrate;
a second well region of a second conductivity type, disposed in the substrate;
a gate structure disposed on the substrate, the gate structure comprising a first sidewall in proximity to the first well region and a second sidewall in proximity to the second well region;
a first conductive region disposed in the first well region; and
a second conductive region disposed in the second well region;
wherein the first conductive region and the second conductive region are epitaxy regions of the second conductivity type and are asymmetric, and
wherein a lightly doped region of the second conductivity type is in contact with the first conductive region and under a sidewall spacer at the first sidewall of the gate structure.

12. The semiconductor device of claim 11, wherein the epitaxy region is a raised structure.

13. The semiconductor device of claim 11, wherein a contact plug is disposed on top of the epitaxy region.

14. The semiconductor device of claim 11, wherein the first well region comprises an epitaxy region.

15. The semiconductor device of claim 11, wherein the gate structure is overlapping with the second well region, an overlapping length being from a boundary of the second well region to the second sidewall of the gate structure, and wherein the overlapping length is from about 0.05 to about 0.25 micrometers.

16. The semiconductor device of claim 11, wherein the semiconductor device is an N-type high-voltage metal-oxide-semiconductor (HVMOS) or a p-type HVMOS.

17. The semiconductor device of claim 11, wherein the epitaxy region comprises a substance with a first lattice constant different from a second lattice constant of the substrate.

18. A high-voltage semiconductor device, comprising:
a substrate;
a gate structure on the substrate, the gate structure having a first sidewall and a second sidewall opposite to the first sidewall;
a first well region of a first conductivity type in the substrate, positioning in proximity to the first sidewall of the gate structure;

a second well region of a second conductivity type in the substrate, positioning in proximity to the second sidewall of the gate structure;
a first epitaxy region disposed in the first well region; and
a second epitaxy region disposed in the second well region,
wherein the first epitaxy region and the second epitaxy region are asymmetric.

* * * * *